United States Patent
Zara (10) Patent No.: US 8,575,700 B2
(45) Date of Patent: Nov. 5, 2013

(54) CHARGE-BALANCE POWER DEVICE COMPRISING COLUMNAR STRUCTURES AND HAVING REDUCED RESISTANCE

(75) Inventor: Fabio Zara, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1084 days.

(21) Appl. No.: 12/134,050

(22) Filed: Jun. 5, 2008

(65) Prior Publication Data

US 2008/0303082 A1 Dec. 11, 2008

(30) Foreign Application Priority Data

Jun. 5, 2007 (IT) .............................. TO2007A0392

(51) Int. Cl.
*H01L 23/62* (2006.01)

(52) U.S. Cl.
USPC .................... 257/355; 257/356; 257/E29.262

(58) Field of Classification Search
USPC ................. 257/329, 342, 355–357, 491–492, 257/E29.262
See application file for complete search history.

(56) References Cited

U.S. PATENT DOCUMENTS

| | | | |
|---|---|---|---|
| 6,586,798 B1 | 7/2003 | Frisina | |
| 6,630,698 B1 | 10/2003 | Deboy et al. | |
| 6,683,347 B1 * | 1/2004 | Fujihira | 257/341 |
| 6,693,338 B2 * | 2/2004 | Saitoh et al. | 257/492 |
| 6,903,418 B2 * | 6/2005 | Iwamoto et al. | 257/342 |
| 7,462,909 B2 * | 12/2008 | Saito et al. | 257/329 |
| 7,576,393 B2 * | 8/2009 | Ono et al. | 257/341 |
| 7,759,733 B2 * | 7/2010 | Ono et al. | 257/341 |
| 7,973,362 B2 | 7/2011 | Willmeroth et al. | |
| 8,008,699 B2 | 8/2011 | Hashimoto et al. | |
| 8,148,815 B2 | 4/2012 | Girdhar et al. | |
| 8,154,088 B1 | 4/2012 | Koueir et al. | |
| 2002/0014671 A1 | 2/2002 | Saggio et al. | |
| 2004/0094819 A1 * | 5/2004 | Saitoh et al. | 257/492 |
| 2006/0175662 A1 * | 8/2006 | Tihanyi et al. | 257/355 |
| 2006/0216896 A1 * | 9/2006 | Saito et al. | 438/270 |

\* cited by examiner

*Primary Examiner* — Matthew W Such
*Assistant Examiner* — Ali Naraghi
(74) *Attorney, Agent, or Firm* — Graybeal Jackson LLP (57) ABSTRACT

A charge-balance power device formed in an epitaxial layer having a first conductivity type and housing at least two columnar structures of a second conductivity type, which extend through the epitaxial layer. A first surface region of the second conductivity type extends along the surface of the epitaxial layer on top of, and in contact with, the columns, and a second surface region of the first conductivity type extends within the first surface region, and also faces the surface of the epitaxial layer. The columns extend at a distance from one another from the first surface region so as to delimit between them an epitaxial portion that defines a current path so as to reduce the on-resistivity of the device.

18 Claims, 6 Drawing Sheets

CHARGE-BALANCE POWER DEVICE COMPRISING COLUMNAR STRUCTURES AND HAVING REDUCED RESISTANCE

PRIORITY CLAIM

This application claims priority from Italian patent application No. TO2007A000392, filed Jun. 5, 2007, which is incorporated herein by reference.

TECHNICAL FIELD

Embodiments of the present disclosure relate to a power device comprising columnar structures and having reduced resistance, and to the relating process.

The disclosure relates, in particular, but not exclusively, to a vertical-conduction power device (for example, a power MOS device or a device of the "Insulated-Gate Bipolar Transistor" (IGBT) type or a device of the "Bipolar Junction Transistor" (BJT) type, or bipolar diodes or Schottky diodes), and the following description refers to this field with the only purpose of simplifying exposition thereof.

BACKGROUND

Vertical-current MOSFET devices are used in various applications, such as DC/DC converters, devices for control and protection of batteries and lamps, and products for the automotive sector.

In particular, in the latter application, devices are required that are able to dissipate low amounts of heat even when they operate in high-current conditions. In practice, the device must present low source-drain on-resistance (Rdson), as well as the ability of withstanding a high reverse biasing voltage (high BVdss).

In vertical-current devices of a planar type, the requisites corresponding to the two parameters referred to above (Rdson and BVdss) are in conflict in so far as to obtain a high reverse voltage it is necessary to increase the epitaxial thickness and/or to increase the resistivity of the epitaxial layer. In both cases, there is an increase in the Rdson since an increase in thickness determines a longer current path in the on state, and a greater resistivity of the epitaxial layer involves a higher resistance to the flow of current.

To reduce the source-drain on resistance it is possible to use a column structure that enables an increase in the body-drain perimeter so as to exploit the entire volume of the epitaxial layer. This technique enables the use of a more heavily doped epitaxial layer, thus one having lower resistivity, for a same reverse voltage, reducing the component of the Rdson due to the epitaxial layer (defined hereinafter as "epitaxial on resistance Repi").

Figure 1:
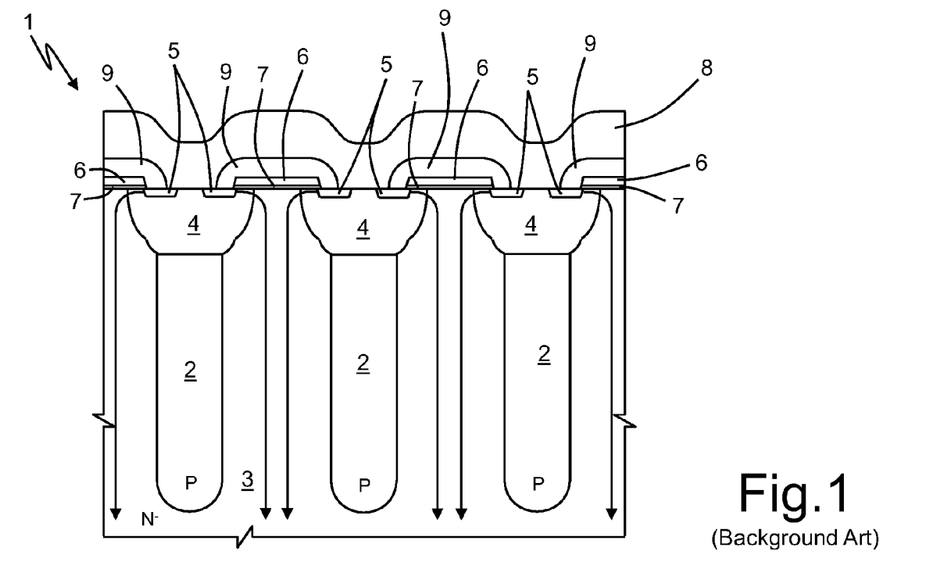
FIG. 1 is a cross-section of a known power MOS device.

An embodiment of a device having a column structure is illustrated in FIG. 1. In particular, FIG. 1 regards a device 1 of N-channel type having an epitaxial layer 3 of N type housing columns 2 of P type underneath body regions 4. Source regions 5 are formed within the body regions 4, and gate regions 6, of polysilicon, extend on top of the epitaxial layer 3, separated therefrom by respective gate-oxide layers 7. A metal region 8 electrically connects the source regions 5 and the body regions 4, and is electrically insulated from the gate regions 6 by insulating regions 9.

Figure 2:
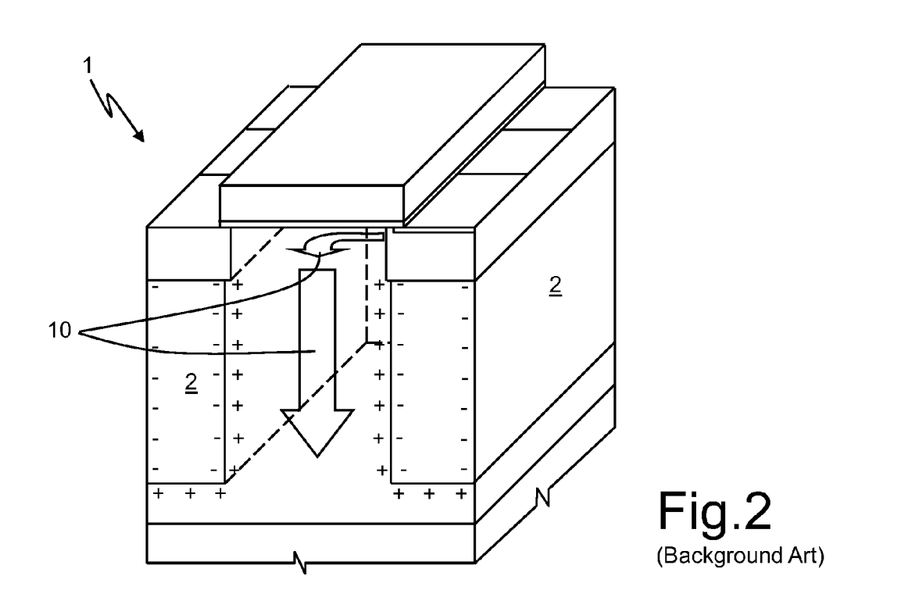
FIG. 2 is a perspective view of a part of the known device of FIG. 1.

The columns 2 extend in a continuous way in the direction perpendicular to the plane of the drawing, for the entire length of the device, parallel to the body regions 4, to form strips or walls as illustrated in FIG. 2.

Embodiments of MOSFET devices with columnar structure are described in U.S. Pat. No. 6,630,698, US 2002/14671, and U.S. Pat. No. 6,586,798.

In devices with columnar structure, it is possible to obtain balance or compensation of charge between the dopant of the columns 2, of P type, and the charge of the epitaxial layer 3, of N type, so that the total charge of the columns 2 is equal and of opposite sign with respect to the total charge of the epitaxial layer 3. This condition involves complete depletion of the free carriers both in the epitaxial layer 3 and in the columns 2 so as to form a carrier-free area, which, behaving like an insulating layer, enables high values of reverse (breakdown) voltage, with an electrical field of almost uniform extension both in modulus and in direction through the entire region comprising the epitaxial layer 3 and the columns 2. In particular, it is possible to bias the device so that the electrical field is close to the critical electrical field, which is the maximum electrical field that a PN junction can withstand at the interface, beyond which the process of avalanche conduction (breakdown) is triggered.

Using the principle of charge balance, it is thus possible to choose a high dopant concentration in the epitaxial layer 3, appropriately balanced by the dopant in the columns. This choice has, however, limits due to the need of calibrating the intercolumnar distance for ensuring complete depletion of the entire epitaxial region, including the columns 2. This distance obviously depends upon the lithographic resolution obtainable with the specific used technology.

Thanks to the configuration of the strips that form the columns 2 (visible in FIG. 2), the current flow, indicated by the arrows 10 in the on state of the device 1, is thus confined between two contiguous columns 2 in conditions of partial depletion, as occurs in conduction.

The value of the epitaxial on-resistance Repi is thus determined by the columnar geometry, and hence by the volume of the epitaxial layer 3 traversed by the current flow comprised between two contiguous columns 2.

SUMMARY

According to an embodiment of the present disclosure, a charge-balance power device is formed in an epitaxial layer having a first conductivity type and housing at least two columnar structures of a second conductivity type, which extend through the epitaxial layer. A first surface region of the second conductivity type extends along the surface of the epitaxial layer on top of, and in contact with, the columns, and a second surface region of the first conductivity type extends within the first surface region, and also faces the surface of the epitaxial layer. The columns extend at a distance from one another from the first surface region so as to delimit between them an epitaxial portion that defines a current path so as to reduce the on-resistivity of the device.

BRIEF DESCRIPTION OF THE DRAWINGS

For a better understanding of the disclosure, embodiments thereof are now described purely by way of non-limiting example and with reference to the attached drawings, wherein.

DETAILED DESCRIPTION

The following discussion is presented to enable a person skilled in the art to make and use the disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Figure 3:
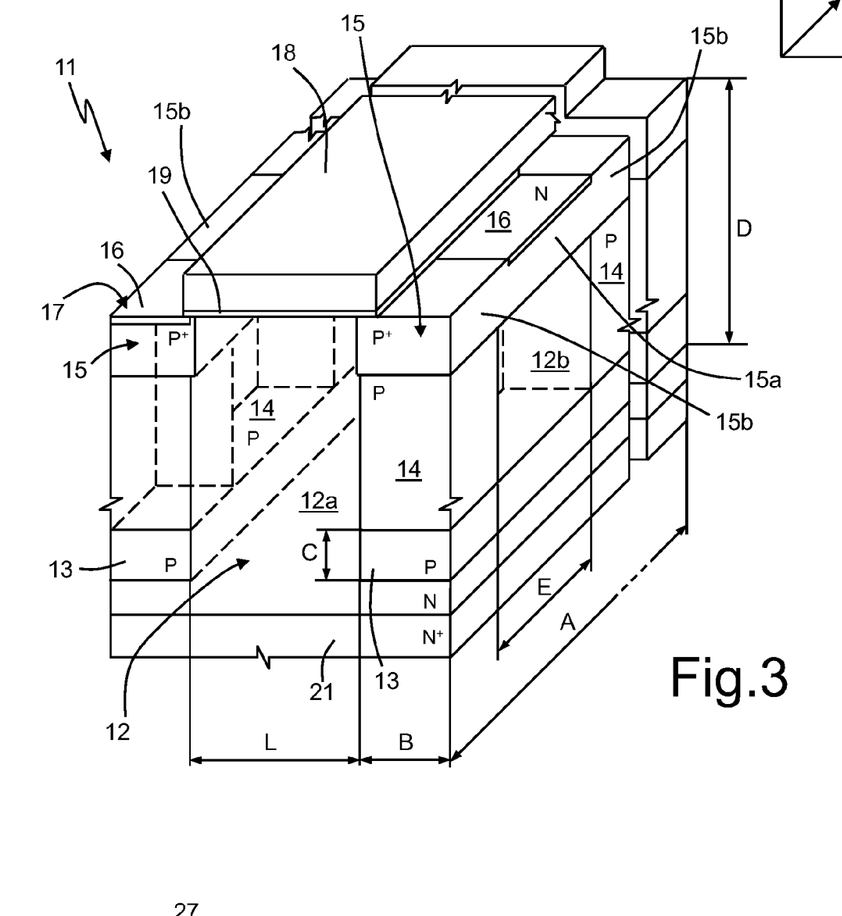
FIG. 3 is a perspective view of a MOS device according to a first embodiment of the disclosure.
Figure 4:
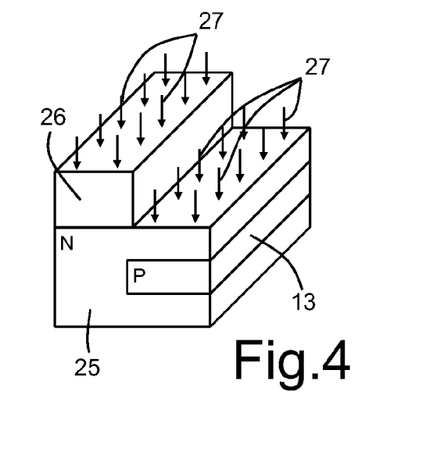
FIGS. 4-11 show perspective sections of one half of the device of FIG. 3 in successive manufacturing steps.
Figure 5:
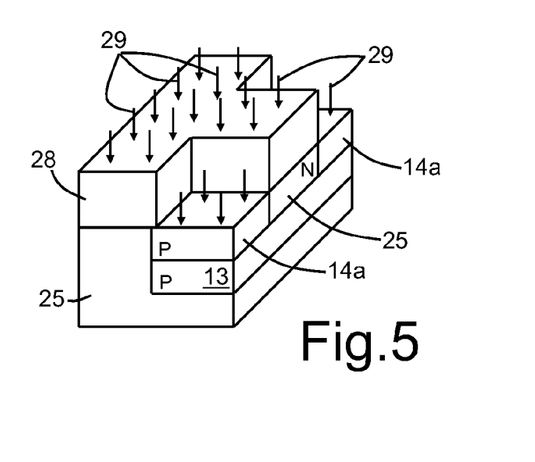
Figure 6:
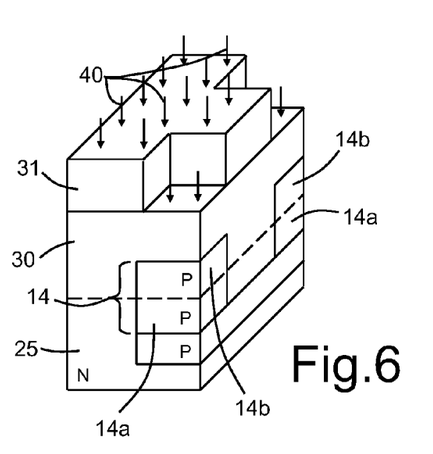
Figure 7:
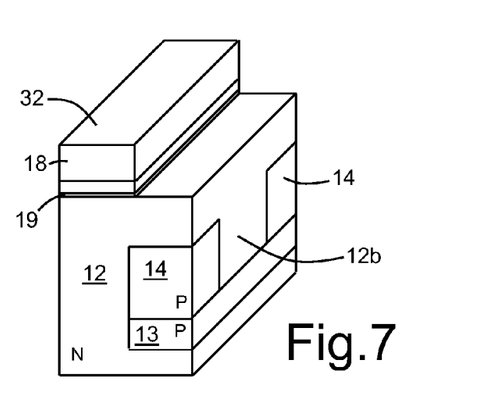
Figure 8:
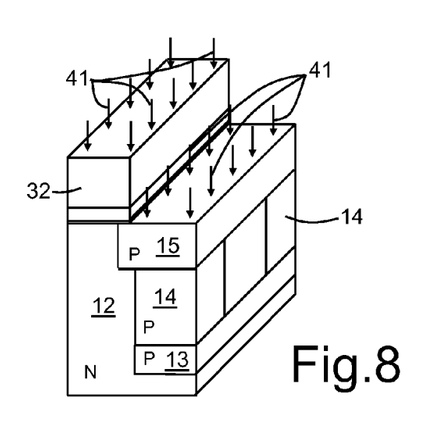

FIG. 3 shows a portion of a MOS device 11 of the charge-compensation type, comprising an epitaxial layer 12 of N type overlying a substrate 21 of N+ type. The epitaxial layer 12 has a surface 17, and the substrate 21 is in contact with a drain metallization (not illustrated).

A gate region 18, of polysilicon, extends on top of the surface 17 and is electrically insulated from the epitaxial layer 12 by a gate-oxide region 19. Body regions 15, of P+ type, extend within the epitaxial layer 12 on the two sides of the gate region 18 and accommodate source regions 16, of N type, facing the surface 17. In practice, the body regions 15 comprise buried body portions 15*a* extending underneath the source regions 16, and surface body portions 15*b* extending laterally with respect to the source regions 16, so that, in top plan view, the surface portions 15*b* alternate with the source regions 16. Furthermore, in the embodiment of FIG. 3, the source regions 16 on one side of the gate region 18 are longitudinally staggered (in the direction Z) with respect to the source regions 16, arranged on the opposite side of the gate region 18. Likewise, the surface body portions 15*b* extending on one side of the gate region 18 are staggered with respect to the surface body portions 15*b* extending on the opposite side of the gate region 18.

Columns 14, of P type, extend vertically within the epitaxial layer 12, from the body regions 15 until buried regions 13, also of P type. In detail, the columns 14 are vertically aligned to the surface body portions 15*b* and thus are staggered with respect to the source regions 16. In the embodiment of FIG. 3, buried regions 13, extend, in the form of strips, within the epitaxial layer 12, preferably for the entire length, in the direction Z, of the MOS device 11, aligned vertically to the body regions 15. In practice, in the example illustrated, the buried regions 13 are substantially congruent with the body regions 15. Moreover, two or more columns 14 with rectangular-base area extend, at a distance from one another, between a body region 15 and the underlying buried region 13 on either side of the gate region 18. The portion of epitaxial layer 12 extending underneath the gate region 18 forms a central epitaxial portion 12*a*, and the portion of the epitaxial layer 12 comprised between two adjacent columns 14, arranged on a same side of the gate region 18, forms a lateral epitaxial portion 12*b*.

The columns 14 aligned in the direction Z are arranged at a mutual distance E and have a length, in the direction X perpendicular to the extension direction Z of the buried regions 13, equal to B. The thickness of the buried regions 13 is equal to C, the total length of each buried region 13 is equal to A, and the distance in the direction X between the buried regions 13 is equal to L. Finally, the height of the columns 14 is equal to D-C.

In the device 11 of FIG. 3, like the device 1 of FIG. 2, the epitaxial layer 12 accommodates first electric charges of N type defining a first charge level, and the columns 14 accommodate second electric charges of P type distributed in a spatially uniform way and defining a second charge level compensating the first charge level.

For a same resistivity p of the epitaxial layer 3, respectively 12, the epitaxial on-resistance Repi3 of the structure of FIG. 3 is lower than the epitaxial on-resistance Repi1 of the structure of FIG. 1 since the on-resistance due to the portion 12*a* of the epitaxial layer 12 is in parallel to the on-resistance due to the portion 12*b* of the epitaxial layer 12. In detail, with reference to FIGS. 1 and 3:

$$Repi1 = \rho \frac{D}{AL} \quad (1)$$

$$Repi3 = (Rc \cdot Rl)/(Rc + Rl) \quad (2)$$

where $$Rc = Repi1 = \rho \frac{D}{L} \quad (3)$$

is the resistance of the central epitaxial portion 12*a*, and $$Rl = \rho \frac{D-C}{BE} \quad (4)$$

is the resistance of the lateral epitaxial portion 12*b*.
It follows that $$Repi3 = Repi1 \left[ \frac{1}{1 + \frac{2BED}{AL(D-C)}} \right] \quad (5)$$

From Eq. (5) it is evident that the epitaxial on-resistance Repi3 of the structure of FIG. 3 is always lower than that of the structure of FIG. 1, for same overall dimensions, thanks to the presence of a number of current paths passing both through the central epitaxial portion 12*a* and through the lateral epitaxial portion 12*b*.

For example, if A=4.8 µm, L=2 µm, E=1.6 µm, and D=4 µm, a gain of 18% is obtained. In general, it is possible to obtain a gain on the total resistance comprised between 14% and 18%.

Figure 22:
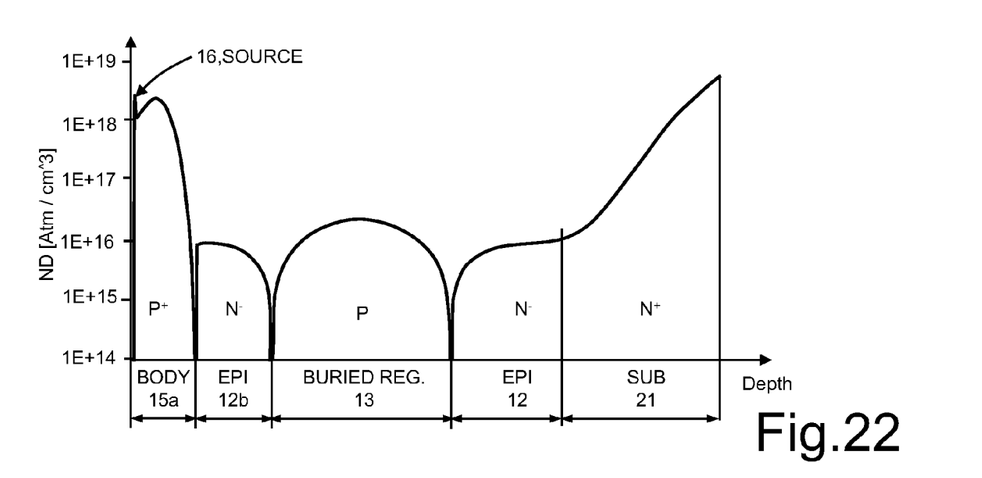
FIGS. 22 and 23 show the concentration profiles of the dopant elements along a line traversing a vertical column and along a vertical line intermediate between two columns of the device of FIG. 3.
Figure 23:
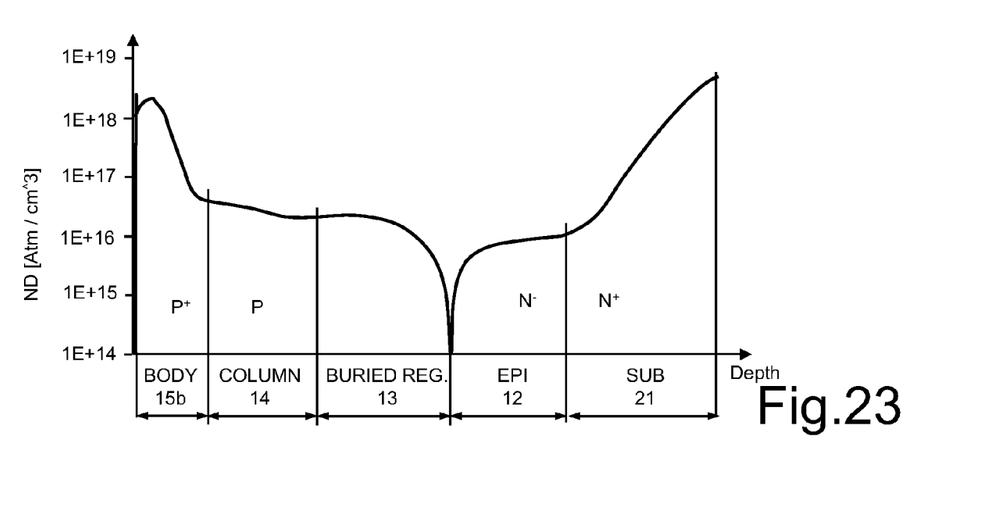

A doping example of the structure of FIG. 3 is illustrated in FIGS. 22 and 23, which shows the doping profile in the vertical direction at a column 14 and, respectively, of the portion 12*b* of the epitaxial layer 12 comprised between two columns 14, where an additional diffusion has been used for the buried regions 13 so as to lengthen the columns 14 towards the substrate 21, causing a shortening of the top part of the epitaxial region 12*b*. In fact, the vertical extension of the epitaxial region 12*b* and of the buried region 13 can be varied according to the class of voltage of the device.

As may be noted from FIG. 23, in the example considered, the buried region 13 has a doping level which is approximately equal to that of the overlying column 14.

The MOS device 11 of FIG. 3 is obtained or manufactured, as described hereinafter and represented in FIGS. 4-11, only with respect to one half of the MOS device 11.

Initially (FIG. 4), a bottom epitaxial layer 25 of N type is grown on the substrate 21 (not illustrated), and the bottom epitaxial layer 25 is covered by a first resist mask 26. A high-energy implant of P type is then performed (represented by the arrows 27) so as to inject the dopant agents in depth, obtaining the buried regions 13 still overlaid by a portion of the bottom epitaxial layer 25.

Then (FIG. 5), after removing the first resist mask 26 and cleaning the wafer, a second resist mask 28 is formed, which covers the surface of the bottom layer 25 except where the columns 14 are to be provided. Then, a second implant of P type follows, as represented by the arrows 29, so as to form bottom parts 14a of the columns 14.

Next (FIG. 6), after removing the second resist mask 28 and cleaning the wafer, a top epitaxial layer 30 is grown, which forms, together with the bottom epitaxial layer 25, the epitaxial layer 12 of FIG. 3. The epitaxial layer 12 is covered by a resist mask 31, and a high-energy implant of P type is then performed (arrows 40) so as to form top parts 14b of the columns 14, contiguous and vertically aligned to the bottom parts 14a. The epitaxial growth, resist masking, and dopant implant can be repeated a number of times until the height required by the voltage class of the device is reached or in order to obtain a greater depth and uniformity of doping of the columns 14. In this case, the individual implantation steps are performed so as to implant the entire depth of the intermediate epitaxial layers.

Then (FIG. 7), a gate-oxide layer and a polysilicon layer are formed in sequence, and are defined using a resist mask 32 to obtain the gate region 18 and the gate oxide region 19.

Next (FIG. 8), using the same resist mask 32, an implant of dopant agents of P type is performed (arrows 41), for forming the body regions 15, which extend in depth until they are in contact with the columns 14.

Figure 9:
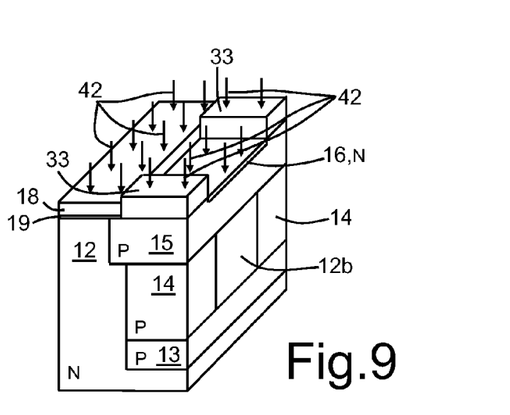

After removing the resist mask 32, the epitaxial layer 12 is again covered by a resist mask 33 so as to leave exposed only the portions where it is desired to form the source regions 16, and the corresponding implant of N type is performed, as represented in FIG. 9 by the arrows 42.

Figure 10:
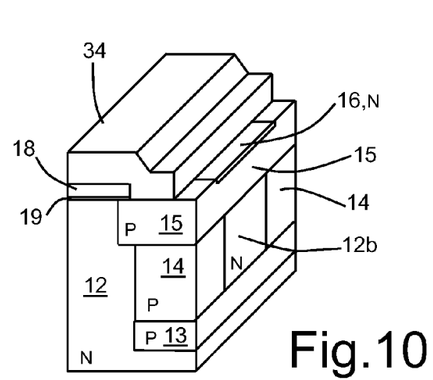

Next, an insulation layer 34 of dielectric material is deposited on the structure thus obtained and then defined, so as to uncover part of the source 16 and body 15 regions, to obtain the structure of FIG. 10.

Figure 11:
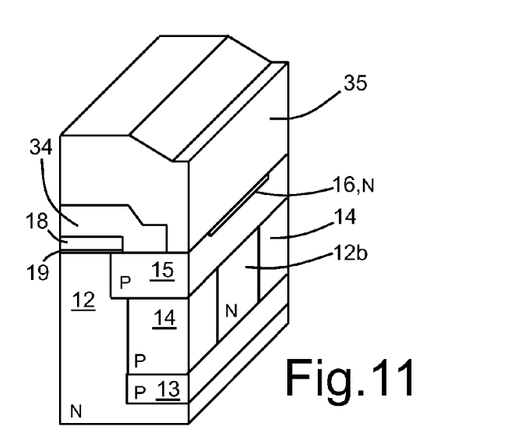

Finally, a metal layer 35 is deposited and defined so that the final structure of FIG. 11 is obtained.

FIGS. 12-17 show different embodiments, which differ as regards the configuration and/or position of the columnar structures.

Figure 12:
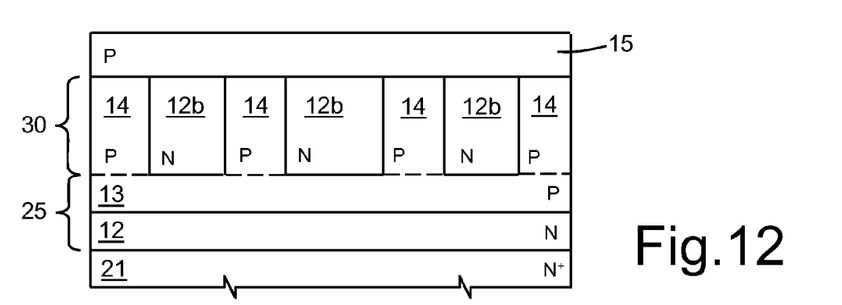
FIGS. 12-17 show cross-sections of variants of the device of FIG. 3, taken along a plane parallel to the axes Y and Z.

In detail, FIG. 12 regards an embodiment wherein the buried regions 13 are implanted so as to extend up to the top surface of the bottom epitaxial layer 25. Then, the top epitaxial layer 30 is grown and selectively implanted so as to form the entire columns 14. The process proceeds with the steps described above, including forming the gate regions (not illustrated), the body regions 15 (so as to obtain the structure of FIG. 12), as well as the source and metal regions.

Alternatively, and in a way not illustrated, instead of forming a single top epitaxial layer 30, it is possible to grow two top epitaxial layers (not illustrated), within which portions (respectively bottom and top) of the columns 14 are formed.

Figure 13:
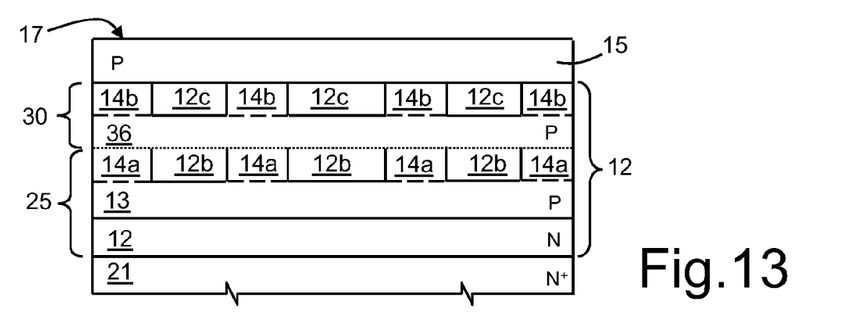

In the structure of FIG. 13, after the steps of growing the bottom epitaxial layer 25, first high-energy implanting to form the buried regions 13, selective implanting to form the bottom portions 14a, and growing the top epitaxial layer 30, as in the embodiment of FIGS. 4-11, a second high-energy implanting is performed so as to form intermediate portions 36, set on top of, and aligned to, the deep regions 13 and coupled to the latter by the bottom portions 14a. Then, a second selective implant is performed to form the top portions 14b of the columns. Thereby, the intermediate portions 36 extend at a distance from the surface 17 of the epitaxial layer 12 and, together with the bottom portions 14a and the top portions 14b of the columns, form, in side view, a grid structure, wherein epitaxial regions 12b, 12c, of N type, are surrounded on four sides by P type regions (including also the body regions 15). In this solution, the insertion of the intermediate portions 36 enables conservation of the charge balance.

Figure 14:
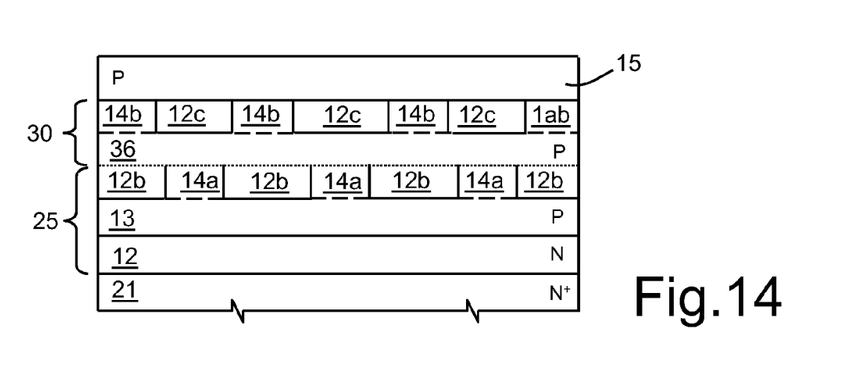

FIG. 14 shows an embodiment wherein the epitaxial regions 12b, 12c are staggered, thanks to the selective implants for forming the bottom 14a and top 14b portions, staggered with respect to one another. In this case, in practice, no linear-structure columns 14 are provided, but columnar structures having a step-like structure and formed by a number of portions staggered with respect to one another. Also in this case, a P type structure is obtained having a grid-like shape in side view.

Figure 15:
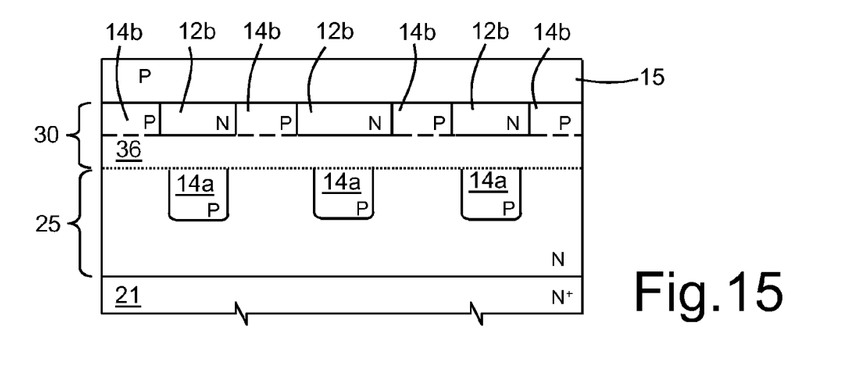

In the embodiment of FIG. 15, the high-energy implant is not performed in the bottom epitaxial layer 25, but only the selective implant is performed for forming the bottom portions 14a of the columnar structures. Furthermore, like FIG. 14, a high-energy implant is made in the top epitaxial layer 30 to form the intermediate portion 36, and a localized implant is made to form the top portions 14b. In this case, then, once again a grid-like structure of P type is obtained, but the bottom portions 14a are contiguous and surrounded on five sides by the bottom part of the bottom epitaxial layer 25 of N type.

Figure 16:
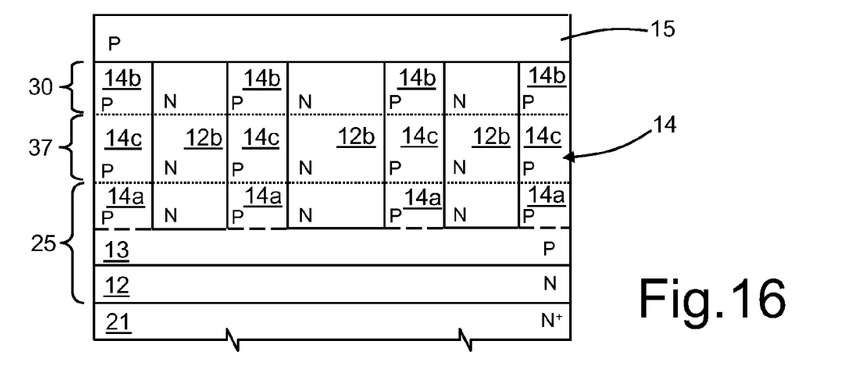

In the embodiment of FIG. 16, three epitaxial growths are performed, namely after growing the bottom epitaxial layer 25, high-energy implanting for forming the deep regions 13, selective implanting for forming the bottom portions 14a, an intermediate epitaxial layer 37 is grown, a selective implant is performed to form intermediate portions 14c of the columns 14, the top epitaxial layer 30 is grown, and a localized implant is made to form the top portions 23b. In this embodiment, the selective implants for forming the portions 14a, 14b and 14c are aligned with respect to one another, so as to form columns 14 of a linear type. Alternatively, analogously to the embodiments of FIGS. 14 and 15, the localized implants in the intermediate epitaxial layer 37 and/or in the top epitaxial layer 30 can be staggered, in which case a high-energy implant is also made to form connection regions between the portions 14a-14c of the columnar structures.

Figure 17:
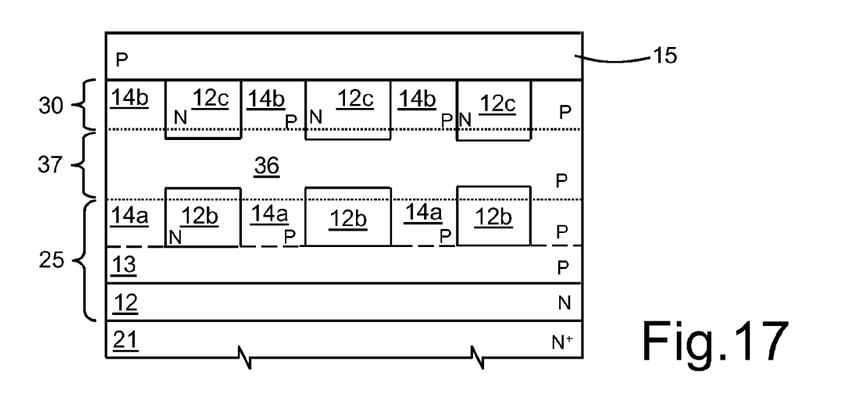

In FIG. 17, three epitaxial growths are again performed, but the intermediate epitaxial layer 37 is subjected to an implant for forming the intermediate region 36. In this way, a structure similar to that of FIG. 13 is obtained, avoiding high-energy implants, but using one epitaxial growth more.

FIGS. 18-21 show different embodiments, which differ as regards the layout of the deep regions 13 and/or of the columns 14 as compared to FIG. 3.

Figure 18:
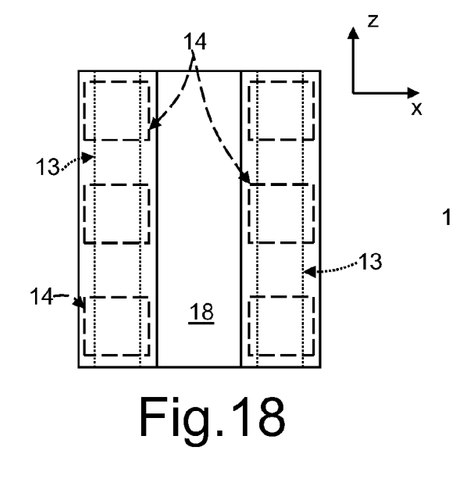
FIGS. 18-21 show different layouts of some regions of the device, according to some variants of the device of FIG. 3 according to other embodiments of the present disclosure.

In the embodiment of FIG. 18, the deep regions 13 are formed by strip-like structures, similar to those of FIG. 3, and the columns 14 are aligned in directions perpendicular to the strips 13 (parallel to the axis X). Also in this case, the source regions 16 (not illustrated) are arranged in the space between adjacent columns and are thus aligned with respect to one another also in a direction parallel to the axis X. However, a slight overstepping of the source regions 16 (not illustrated) on top of the columns 14, but not in electrical contact therewith, does not jeopardize operation of the device.

Figure 19:
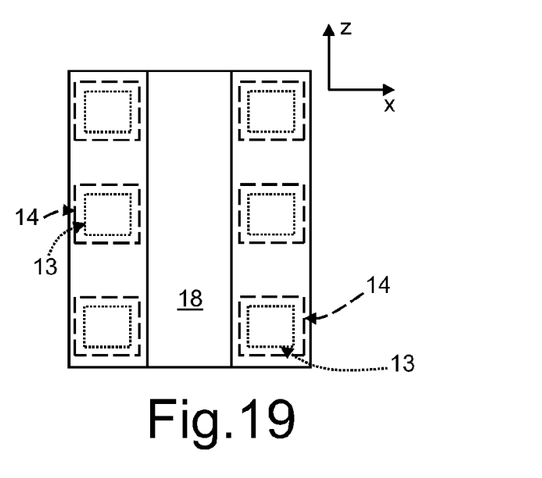

In FIG. 19, the buried regions 13 are provided by discrete portions, aligned vertically to the columns 14 and of slightly smaller area. In practice, a number of deep regions 13, of polygonal (rectangular or square) shape, or some other shape, extend on both sides of the gate region 18, aligned with respect to one another in the directions X and Z.

Figure 20:
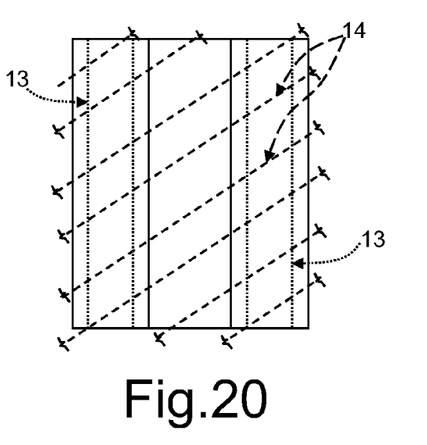

In FIG. 20, the deep regions 13 have a strip-like shape, similar to those of FIG. 3, and the columns 14 have a strip-like shape and extend obliquely with respect to the deep regions 13, also underneath the gate region 18.

Figure 21:
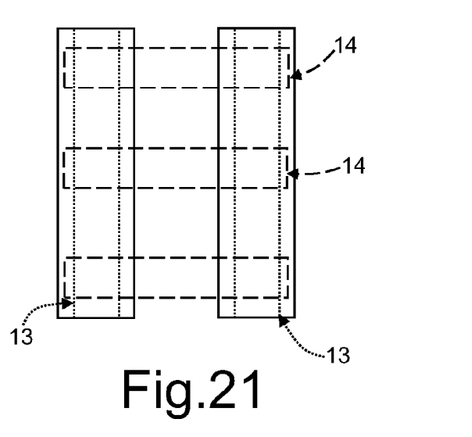

Finally, in FIG. 21, the columns 14 extend, in top plan view, perpendicular to the deep regions 13, also here passing underneath the gate regions 18.

Finally, it is evident that modifications and variations can be made to the device and process of fabrication described herein, without thereby departing from the scope of the present disclosure.

For example, the buried regions 13 can extend only for a portion of the length of the device (in the direction Z of FIG. 3) and/or be formed by discrete portions that connect two or more columns at the bottom.

The columns 14 can be provided in different epitaxial layers arranged on top of one another, as described above, or else only in the top epitaxial layer 30 (as in FIG. 12). Alternatively, the columns 14 can be provided only in the bottom epitaxial layer 25, in which case the body regions 15 extend throughout the thickness of the top epitaxial layer 30.

Furthermore, the source regions 16 can be aligned with respect to one another in the direction X on the two sides of the gate region 18, and, likewise, the surface body portions 15a can be aligned with respect to one another in the direction X on the two sides of the gate region 18, analogously to FIG. 18, also in the case of columnar structures of a different type, as in FIGS. 13-17.

Devices as described above and according to other embodiments of the present disclosure can be utilized in a variety of different types of electronic systems, such as DC-DC voltage converted, devices for the control and protection of batteries and lamps, and automotive devices.

From the foregoing it will be appreciated that, although specific embodiments of the disclosure have been described herein for purposes of illustration, various modifications may be made without deviating from the spirit and scope of the disclosure.

The invention claimed is:

1. A charge-balance power device, comprising:
   a semiconductor layer having a first conductivity type and a surface;
   at least two columnar structures of a second conductivity type, extending through said semiconductor layer;
   a first surface region of the second conductivity type, extending along said surface, on top of and in contact with each of the at least two columnar structures; and
   a second surface region of the first conductivity type, extending within the first surface region and facing said surface and disposed between portions of the first surface region that are in contact with each of the at least two columnar structures,
   wherein the columnar structures extend from the first surface region and are separated at a distance from each other such that the columnar structures are disposed under the first surface region and not under the second surface region.

2. The power device according to claim 1, comprising at least one buried region of said second conductivity type, extending underneath and in contact with said columnar structures.

3. The power device according to claim 2, wherein said buried region extends in a transverse direction with respect to said columnar structures.

4. The power device according to claim 2, wherein said buried region extends parallel to and is vertically aligned to said first surface region.

5. The power device according to claim 1, wherein the columnar structures comprise top portions in contact with the first surface region, bottom portions extending underneath the top portions, and at least one intermediate portion extending parallel to and at a distance from the first surface region and connecting electrically the top portions and the bottom portions of said columnar structures.

6. The power device according to claim 5, wherein the top portions and bottom portions of the columnar structures are arranged selectively, vertically aligned and vertically staggered with respect to one another.

7. The power device according to claim 1, comprising at least one third surface region of the second conductivity type, the third surface region extending along said surface parallel to and at a distance from said first surface region, wherein the columnar structures extend in a transverse direction with respect to said first and third surface regions, each columnar structure being connected both to said first surface region and to said third surface region.

8. The power device according to claim 1, and forming a MOS transistor, comprising:
   at least one insulated gate region extending on top of said semiconductor layer;
   a third surface region of the second conductivity type, extending along said surface, the first and the third surface regions extending on opposite sides of said insulated gate region and each forming a body region;
   at least two columnar structures of the second conductivity type extending within said body starting from said third surface region;
   at least one fourth surface region of the first conductivity type extending within the third surface region and facing said surface,
   wherein the second and the fourth surface region form source regions, and the source regions are staggered with respect to the columnar structures.

9. The power device according to claim 1, wherein the semiconductor layer accommodates first electric charges defining a first charge level and the columnar structures accommodate second electric charges distributed in a spatially uniform way.

10. The power device according to claim 9, wherein the second electric charges locally compensate the first charge level.

11. A power device, comprising: a substrate having a first conductivity type; a semiconductor layer formed on the substrate and having the first conductivity type and first and second surfaces, the second surface being defined as a junction between the semiconductor layer and the substrate; body regions having a second conductivity type formed in the semiconductor layer spaced apart from one another and extending from the first surface of the semiconductor layer; source regions formed in the body regions; at least two columnar structures formed in the semiconductor layer, the columnar structures being spaced apart from one another and each of the at least two columnar structures having the second conductivity type and in contact with and extending from a corresponding one of the body regions towards the second surface of the semiconductor layer, each columnar structure spaced apart from the source regions such that no columnar structure is disposed directly under any one of the source regions a gate structure formed on the first surface of the semiconductor layer and being positioned between and partially overlapping the body regions; and a drain contact formed on a surface of the substrate opposite the surface on which the semiconductor layer is formed.

12. The power device of claim 11 further comprising at least two buried regions having the second conductivity type formed in the semiconductor layer near the second surface of the semiconductor layer, each columnar structure extending from the first surface of the semiconductor layer to contact a corresponding buried region.

13. The power device of claim 11 further comprising an additional plurality of columnar structures formed extending from each body region, with a plurality of source regions being formed spaced apart from one another in each of the body regions and the column structures extending from a portions of the body regions between adjacent source regions.

14. The power device of claim 11 wherein the semiconductor layer comprises an epitaxial layer.

15. The power device of claim 11 wherein the first conductivity type is n-type and the second conductivity type is p-type.

16. An electronic system, comprising: electronic circuitry operable to perform a desired function, the electronic circuitry including at least one power device and at least some of the power devices comprising, a substrate having the first conductivity type; a semiconductor layer formed on the substrate and having the first conductivity type and first and second surfaces, the second surface being defined as the junction between the semiconductor layer and the substrate; body regions having a second conductivity type formed in the semiconductor layer spaced apart from one another and extending from the first surface of the semiconductor layer; source regions formed in the body regions; at least two columnar structures formed in the semiconductor layer, the columnar structures being spaced apart from one another and the each of the at least two columnar structures having the second conductivity type and in contact with and extending from a corresponding one of the body regions towards the second surface of the semiconductor layer, the at least two columnar structures arranged staggered to one another with respect to a first direction and partially facing one another with respect to a second direction transversal to the first direction such that no columnar structure is disposed directly under any one of the source regions; a gate structure formed on the first surface of the semiconductor layer and being positioned between and partially overlapping the body regions; and a drain contact formed on a surface of the substrate opposite the surface on which the semiconductor layer is formed.

17. The electronic system of claim 16 wherein the electronic circuitry comprises automotive circuitry.

18. A method of forming a power device in a semiconductor, comprising: a substrate having the first conductivity type; a semiconductor layer formed on the substrate and having the first conductivity type and first and second surfaces, the second surface being defined as the junction between the semiconductor layer and the substrate; body regions having a second conductivity type formed in the semiconductor layer spaced apart from one another and extending from the first surface of the semiconductor layer; source regions formed in the body regions; at least two columnar structures formed in the semiconductor layer, the columnar structures being spaced apart from one another and having the second conductivity type, the at least two columnar structures in contact with and extending from a corresponding one of the body regions towards the second surface of the semiconductor layer, the at least two columnar structures arranged staggered to one another with respect to a first direction and partially facing one another with respect to a second direction transversal to the first direction such that no columnar structure is disposed directly under any one of the source regions; a gate structure formed on the first surface of the semiconductor layer and being positioned between and partially overlapping the body regions; and a drain contact formed on a surface of the substrate opposite the surface on which the semiconductor layer is formed.

* * * * *